US 9,293,403 B2

(12) United States Patent  
Park et al.

(10) Patent No.: US 9,293,403 B2  
(45) Date of Patent: Mar. 22, 2016

(54) SEMICONDUCTOR PACKAGE WITH IMPROVED REDISTRIBUTION LAYER DESIGN AND FABRICATING METHOD THEREOF

(71) Applicant: Amkor Technology, Inc., Tempe, AZ (US)

(72) Inventors: No Sun Park, Gyeonggi-do (KR); Ji Yeon Ryu, Gyeonggi-do (KR); Go Woon Jung, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/955,422

(22) Filed: Jul. 31, 2013

(65) Prior Publication Data

US 2014/0061900 A1    Mar. 6, 2014

(30) Foreign Application Priority Data

Aug. 30, 2012  (KR) .......................... 10-2012-0095947

(51) Int. Cl.
*H01L 23/498*  (2006.01)
*H01L 21/48*  (2006.01)
(Continued)

(52) U.S. Cl.
CPC ...... *H01L 23/49811* (2013.01); *H01L 21/4853* (2013.01); *H01L 23/3114* (2013.01); *H01L 23/3192* (2013.01); *H01L 24/03* (2013.01); *H01L 24/05* (2013.01); *H01L 24/06* (2013.01); *H01L 23/525* (2013.01); *H01L 24/13* (2013.01);
(Continued)

(58) Field of Classification Search
CPC .............. H01L 23/49811; H01L 21/4853; H01L 2224/023; H01L 2224/0231; H01L 2224/02311; H01L 2224/0233; H01L 2224/02331; H01L 2224/0237; H01L 2224/06137; H01L 2224/06157; H01L 2224/06167
USPC .......................................... 257/737; 438/613
See application file for complete search history.

(56) References Cited

U.S. PATENT DOCUMENTS 5,517,515 A    5/1996  Spall
2009/0184411 A1    7/2009  Chung
(Continued)

FOREIGN PATENT DOCUMENTS

KR    1020090080752 A    7/2009
KR    1020100033643    10/2011
KR    10-1121827    2/2012

OTHER PUBLICATIONS

Korean Office Action of the Korean Patent Application No. 10-2012-0095947.

*Primary Examiner* — Peniel M Gumedzoe
(74) *Attorney, Agent, or Firm* — McAndrews, Held & Malloy

(57) ABSTRACT

A semiconductor package with improved redistribution layer design and fabricating method thereof are disclosed and may include a semiconductor die comprising bond pads, a first redistribution layer (RDL) formed on the semiconductor die. The first RDL has a first end coupled to a bond pad and a second end coupled to a solder bump via under bump metal layers. A second RDL is formed in a same plane of the semiconductor die as the first RDL and is electrically isolated from the first RDL. A first end of the second RDL may be coupled to a bond pad and the second RDL may pass underneath, but be electrically isolated from, the solder bump. A passivation layer may be formed on the first and second RDLs exposing the second end of the first RDL. The under bump metal layers may be formed on the second end of the first RDL exposed by the passivation layer.

22 Claims, 19 Drawing Sheets

(51) Int. Cl.
*H01L 23/31* (2006.01)
*H01L 23/00* (2006.01)
*H01L 23/525* (2006.01)

(52) U.S. Cl.
CPC ............... *H01L 2224/0235* (2013.01); *H01L 2224/02123* (2013.01); *H01L 2224/02331* (2013.01); *H01L 2224/02373* (2013.01); *H01L 2224/02375* (2013.01); *H01L 2224/0347* (2013.01); *H01L 2224/0401* (2013.01); *H01L 2224/0508* (2013.01); *H01L 2224/05008* (2013.01); *H01L 2224/05011* (2013.01); *H01L 2224/05012* (2013.01); *H01L 2224/05018* (2013.01); *H01L 2224/05024* (2013.01); *H01L 2224/05124* (2013.01); *H01L 2224/05155* (2013.01); *H01L 2224/05166* (2013.01); *H01L 2224/05171* (2013.01); *H01L 2224/05557* (2013.01); *H01L 2224/05558* (2013.01); *H01L 2224/05568* (2013.01); *H01L 2224/05647* (2013.01); *H01L 2224/06051* (2013.01); *H01L 2224/10* (2013.01); *H01L 2224/13027* (2013.01); *H01L 2224/13111* (2013.01); *H01L 2224/13116* (2013.01); *H01L 2224/13139* (2013.01); *H01L 2924/00014* (2013.01)

(56) References Cited

U.S. PATENT DOCUMENTS

| | | | |
|---|---|---|---|
| 2011/0156248 A1* | 6/2011 | Matsuki | 257/737 |
| 2012/0129334 A1 | 5/2012 | Chung | |
| 2013/0134580 A1* | 5/2013 | Bao et al. | 257/737 |

* cited by examiner

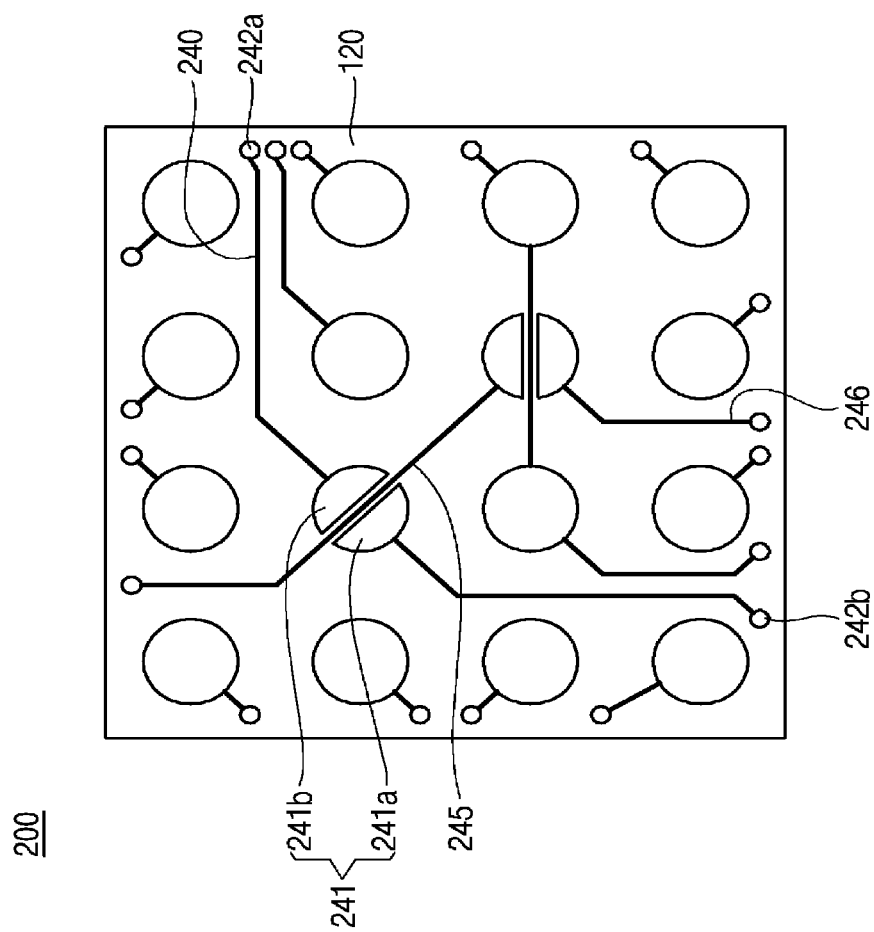

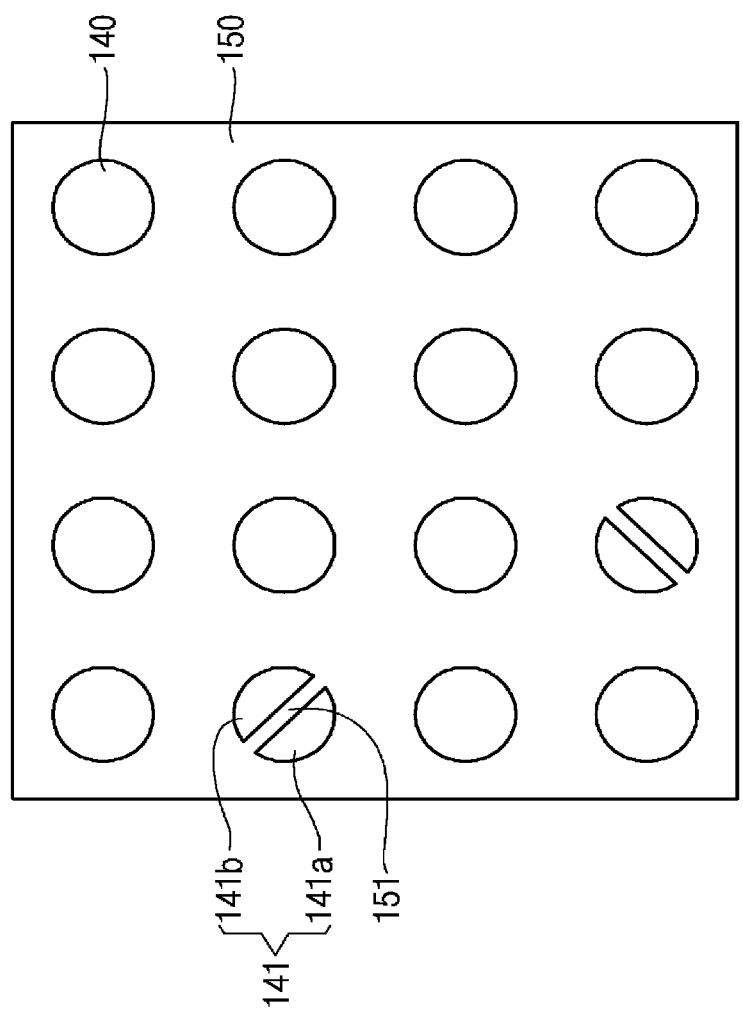

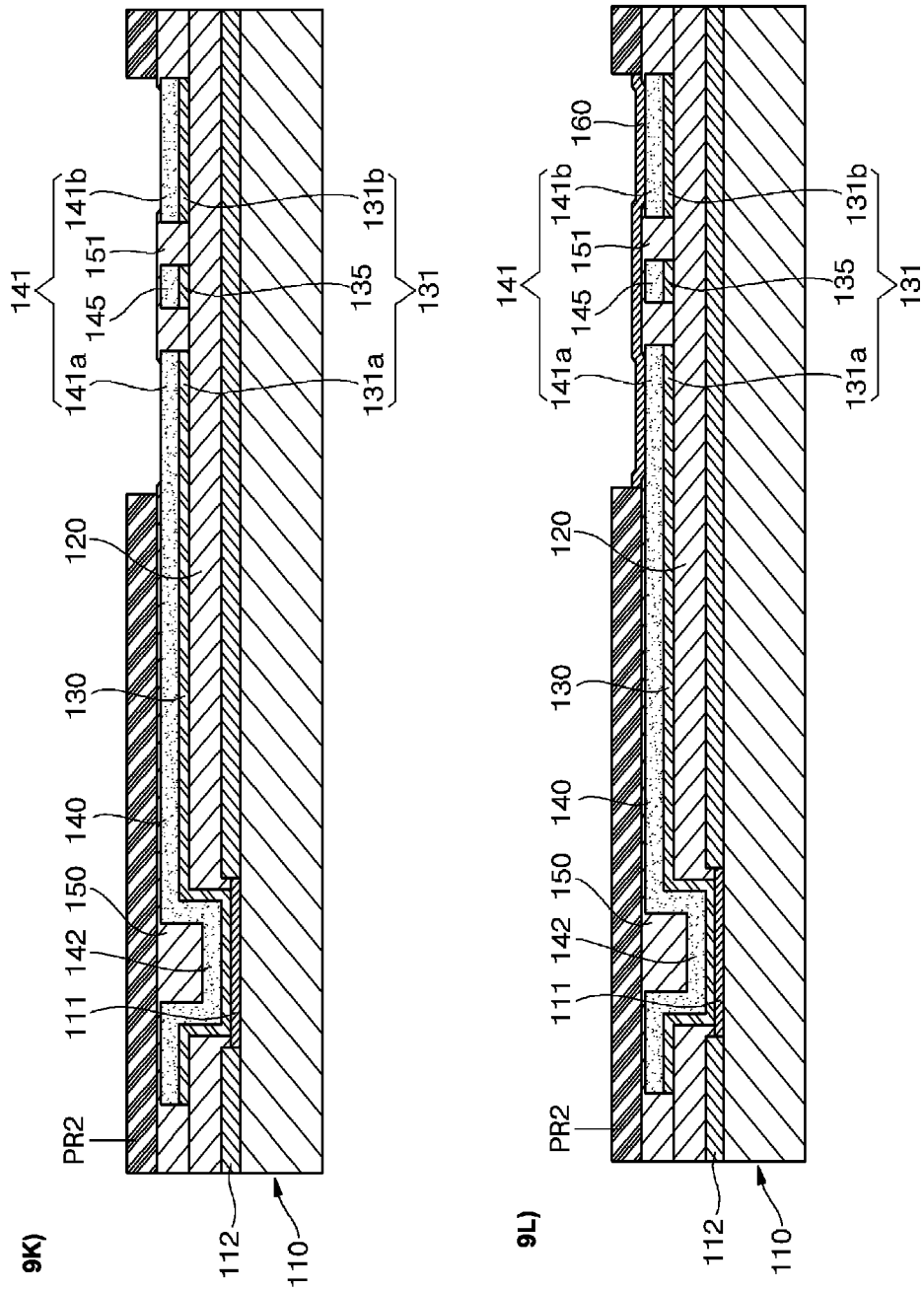

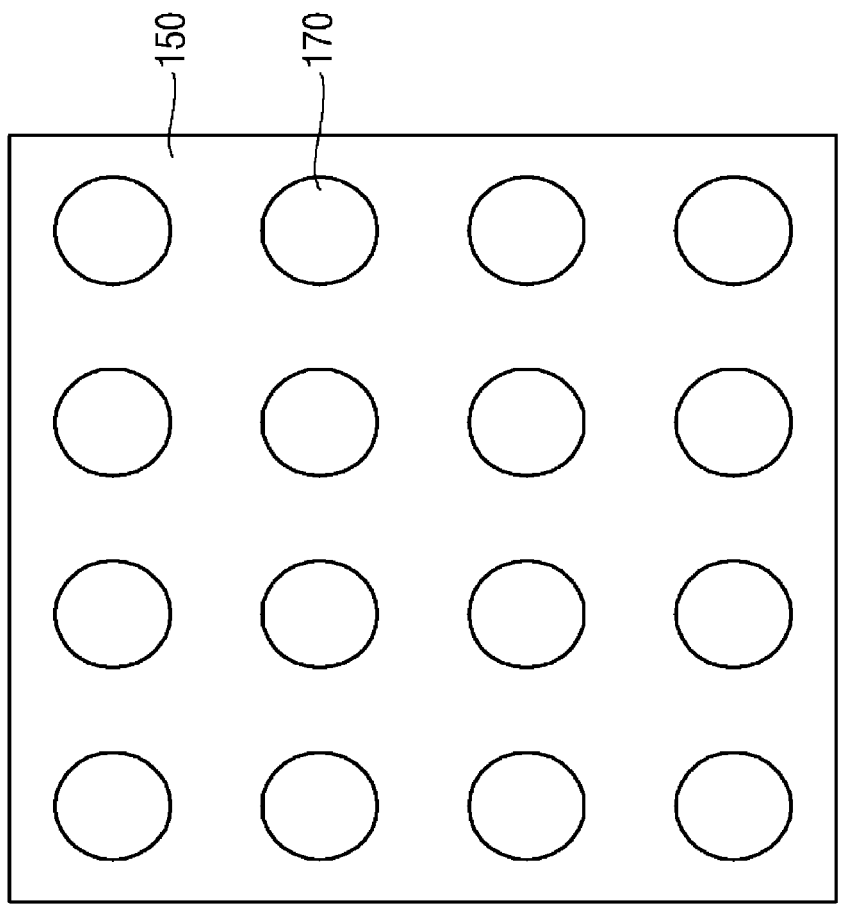

US 9,293,403 B2

SEMICONDUCTOR PACKAGE WITH IMPROVED REDISTRIBUTION LAYER DESIGN AND FABRICATING METHOD THEREOF

CROSS REFERENCE TO RELATED APPLICATIONS

The present application makes reference to, claims priority to, and claims the benefit of Korean Patent Application No. 10-2012-0095947, filed on Aug. 30, 2012, the contents of which are hereby incorporated herein by reference, in their entirety.

FIELD OF THE INVENTION

Certain embodiments of the invention relate to semiconductor chip packaging. More specifically, certain embodiments of the invention relate to a semiconductor package with improved redistribution layer design and fabricating method thereof.

BACKGROUND OF THE INVENTION

A semiconductor package is used in a variety of products. According to the recent tendency toward lightweight, slim and compact products, in order to downsize semiconductor packages, flip chip packages or TSV packages are drawing attention. In the flip chip package, a solder bump is directly formed on a surface of a semiconductor die. In the TSV package, a through silicone via (TSV) is formed on a bond pad of a semiconductor die, and a solder bump is formed on the TSV.

The flip chip package or the TSV package generally includes a redistribution layer (RDL) connected to a bond pad of a semiconductor die to redistribute portions to be connected to a solder bump and an under bump metal (UBM) connected to the RDL to increase bonding strength with the solder bump.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

FIG. 6 is a plan view illustrating a state in which a redistribution layer (RDL) is formed in a semiconductor package, in accordance with an example embodiment of the present invention.

DETAILED DESCRIPTION OF THE INVENTION

Figure 1:
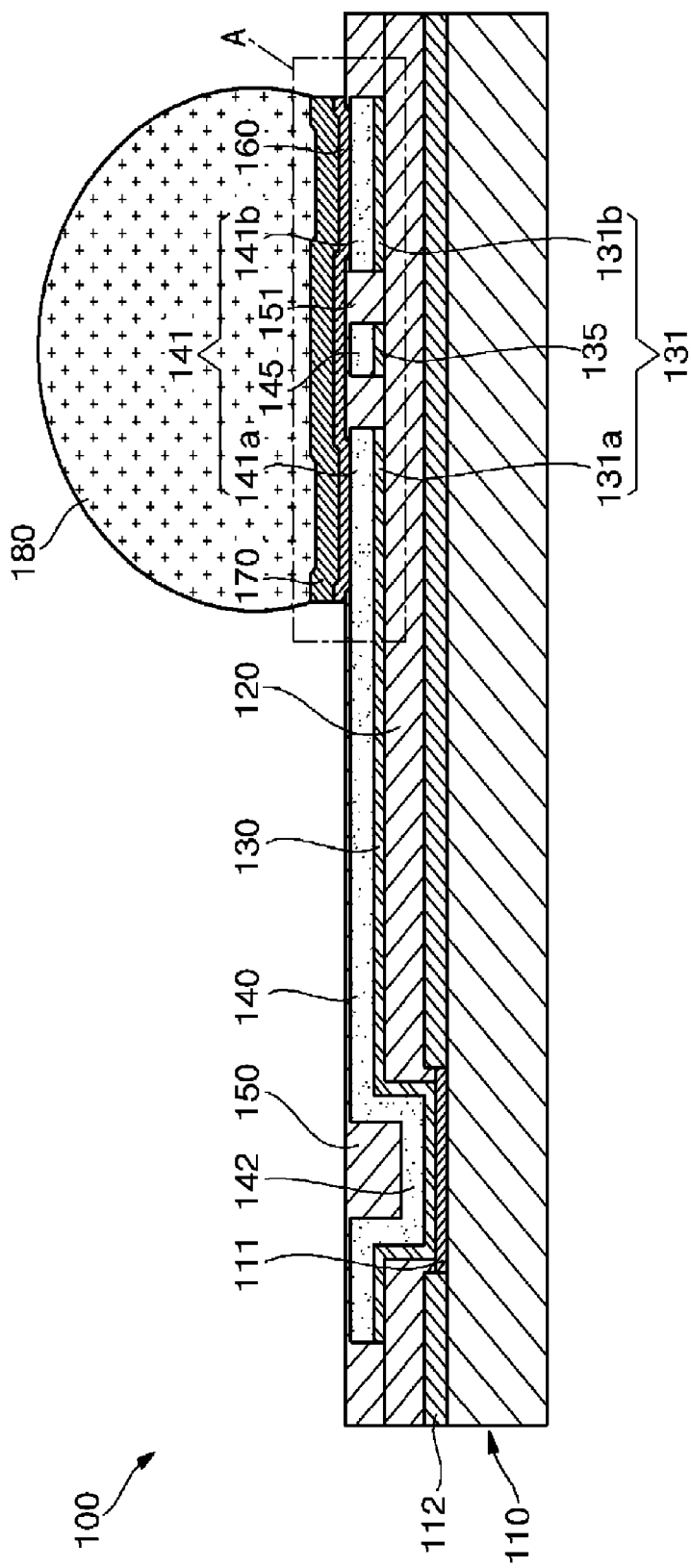
FIG. 1 is a cross-sectional view of a semiconductor package according to an example embodiment of the present invention.

Certain aspects of the invention may be found in a semiconductor package with improved redistribution layer design and fabricating method thereof. Example aspects of the invention may comprise a semiconductor die comprising a plurality of bond pads, a first redistribution layer (RDL) formed on the semiconductor die with a first end coupled to a bond pad and a second end coupled to a solder bump via one or more under bump metal layers, and a second RDL formed in a same plane of the semiconductor die as at least a portion of the first RDL and electrically isolated from the first RDL. A first end of the second RDL may be coupled to at least one of the plurality of bond pads and the second RDL may pass underneath, but electrically isolated from, the solder bump coupled to the second end of the first RDL. A passivation layer may be formed on the first RDL and the second RDL exposing the second end of the first RDL. The one or more under bump metal layers may be formed on the second end of the first RDL exposed by the passivation layer. The passivation layer may electrically isolate the first RDL and the solder bump from the at least one second RDL. The passivation layer may be formed between the under bump metal and the second RDL. The passivation layer may be formed between the first RDL and the second RDL. The passivation layer may, for example, comprise one or more of: polyimide (PI), benzocyclobutene (BCB), polybenzoxazole (PBO), bismaleimide-triazine (BT), phenolic resin, epoxy, silicone, oxide ($SiO_2$), and nitride ($Si_3N_4$). A second end of the second RDL may be coupled to a second solder bump via one or more under bump metal layers. A third RDL may pass underneath, but be electrically isolated from, the solder bump coupled to the second end of the first RDL. The first RDL and the second RDL may be formed on one or more seed layers.

Aspects of the present invention provide a semiconductor package and a fabricating method thereof, which can overcome a limitation of redistribution layer (RDL) design and can increase the degree of freedom in RDL design, by allowing at least one second RDL to pass through a region where a first RDL is formed.

In accordance with one aspect of the present invention, there is provided a semiconductor package comprising a semiconductor die having a plurality of bond pads formed thereon, a first redistribution layer (RDL) formed on the semiconductor die and having one end electrically connected to the bond pads, at least one second RDL passing through the other end of the first RDL and formed to be electrically insulated from the first RDL, a passivation layer formed on the first RDL and the second RDL and exposing the other end of the first RDL, and an under bump metal (UBM) formed on the passivation layer and electrically connected to the other end of the exposed first RDL.

The first RDL and the second RDL may be formed on the same plane. The first RDL and the second RDL may be spaced apart from each other. The passivation layer may be formed to cover an intersection area of the first RDL and the second RDL. The passivation layer may be interposed between the first RDL and the second RDL. The passivation layer may be interposed between the second RDL and the UBM. The semiconductor package may further include a solder bump formed on the UBM to surround the UBM. The first RDL may be electrically connected to the plurality of bond pads. The second RDL may be electrically connected to another first RDL in the vicinity of the second RDL.

In accordance with one aspect of the present invention, there is provided a fabricating method of a semiconductor package including providing a semiconductor die having a plurality of bond pads formed thereon. The method comprises forming a first redistribution layer (RDL) positioned on the semiconductor die and having one end electrically connected to the bond pads and at least one second RDL passing through the other end of the first RDL and formed to be electrically insulated from the first RDL, forming a passivation layer on the first RDL and the second RDL to expose the other end of the first RDL, and forming an under bump metal (UBM) on the passivation layer to be electrically connected to the other end of the exposed first RDL.

The forming of the RDL may be formed with the first RDL and the second RDL on the same plane. The forming of the RDL may be formed with the first RDL and the second RDL spaced apart from each other. The forming of the passivation layer may comprise the passivation layer covering an intersection area of the first RDL and the second RDL. The passivation layer may be interposed between the first RDL and the second RDL. The passivation layer may be interposed between the second RDL and the UBM. The fabricating method of the semiconductor package may further include, after the forming of the UBM, forming a solder bump on the UBM to surround the UBM. As described above, in the semiconductor package and the fabricating method thereof according to the invention, at least one second RDL may be allowed to pass through a region where a first RDL is formed, thereby overcoming a limitation of redistribution layer (RDL) design and increasing the degree of freedom in RDL design.

Figure 2:
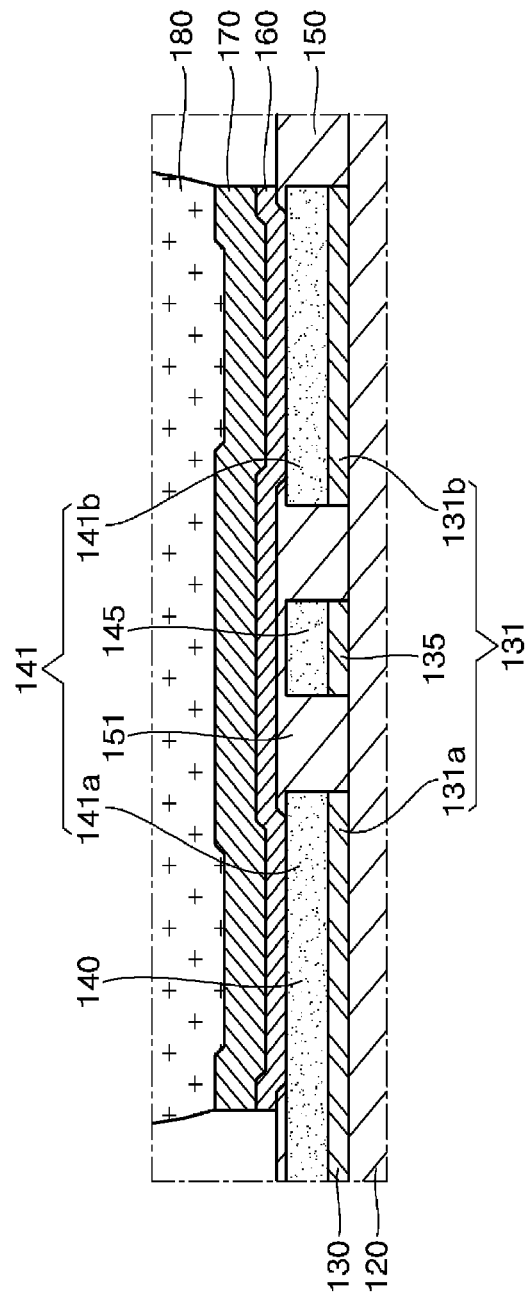
FIG. 2 is an enlarged view of an 'A' portion, in accordance with an example embodiment of the present invention.
Figure 3:
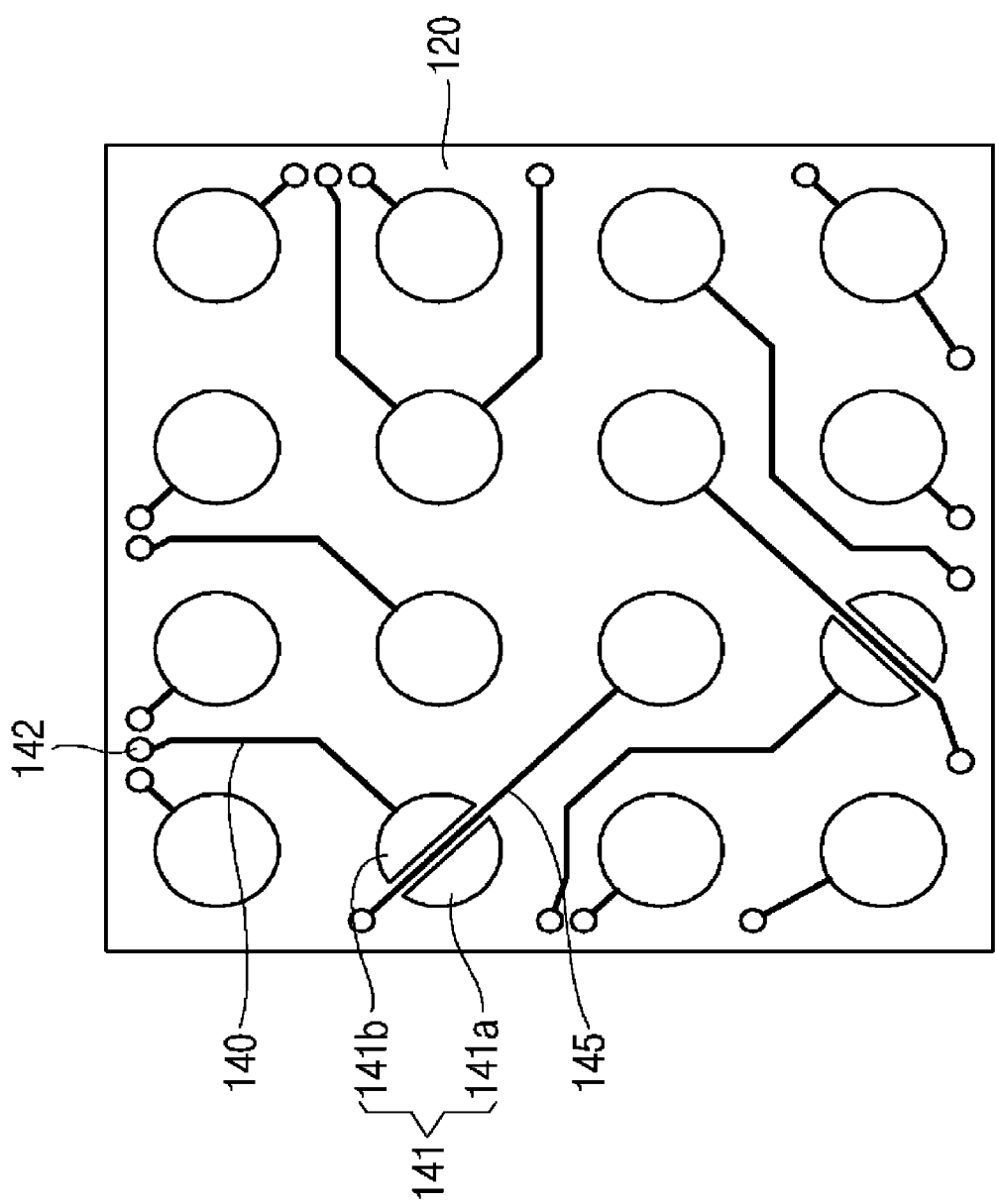
FIG. 3 is a plan view illustrating a state in which a redistribution layer (RDL) is formed in the semiconductor package shown in FIG. 1.
Figure 4:
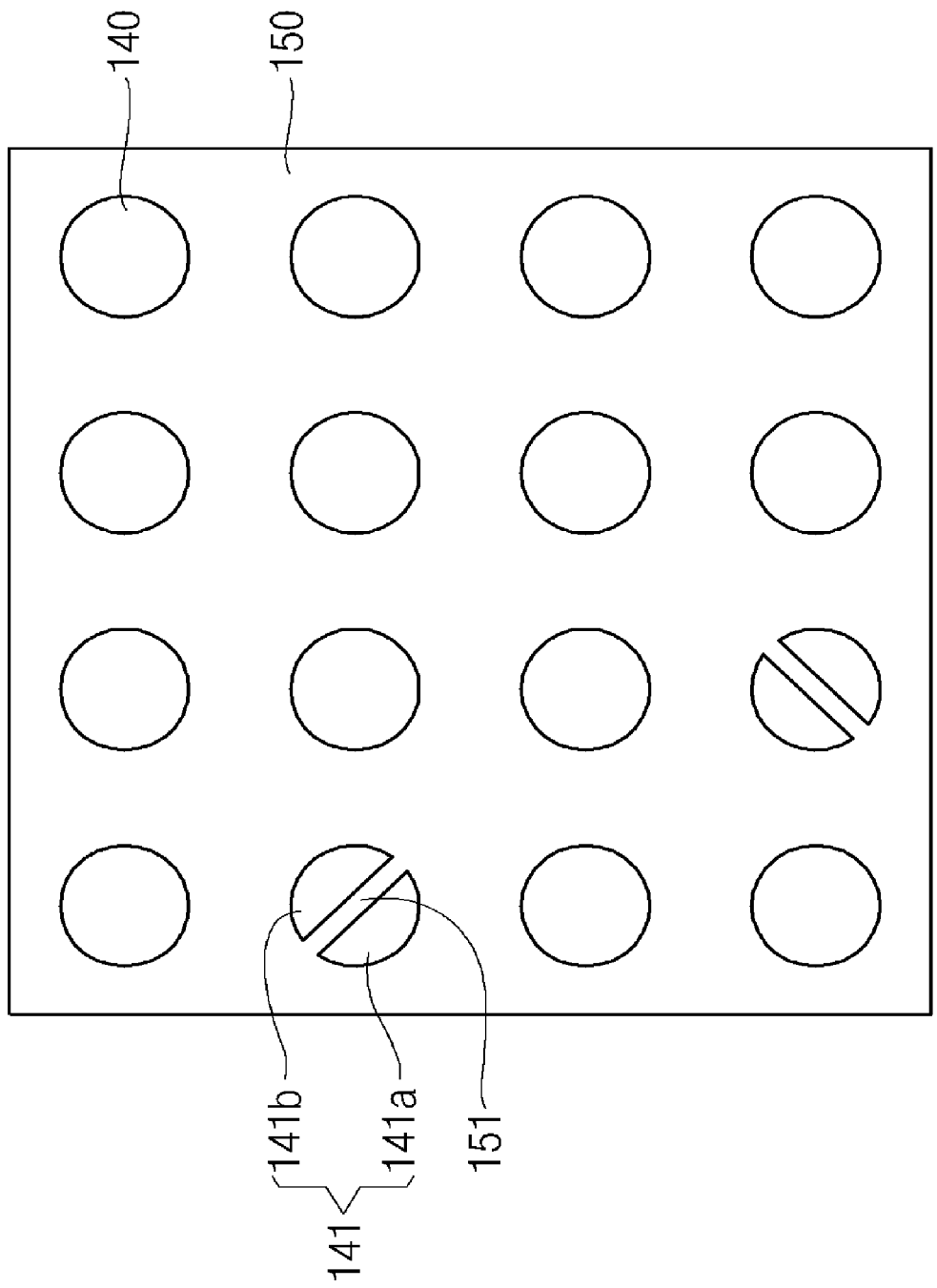
FIG. 4 is a plan view illustrating a state in which a passivation layer is formed in the semiconductor package, in accordance with an example embodiment of the invention.
Figure 5:
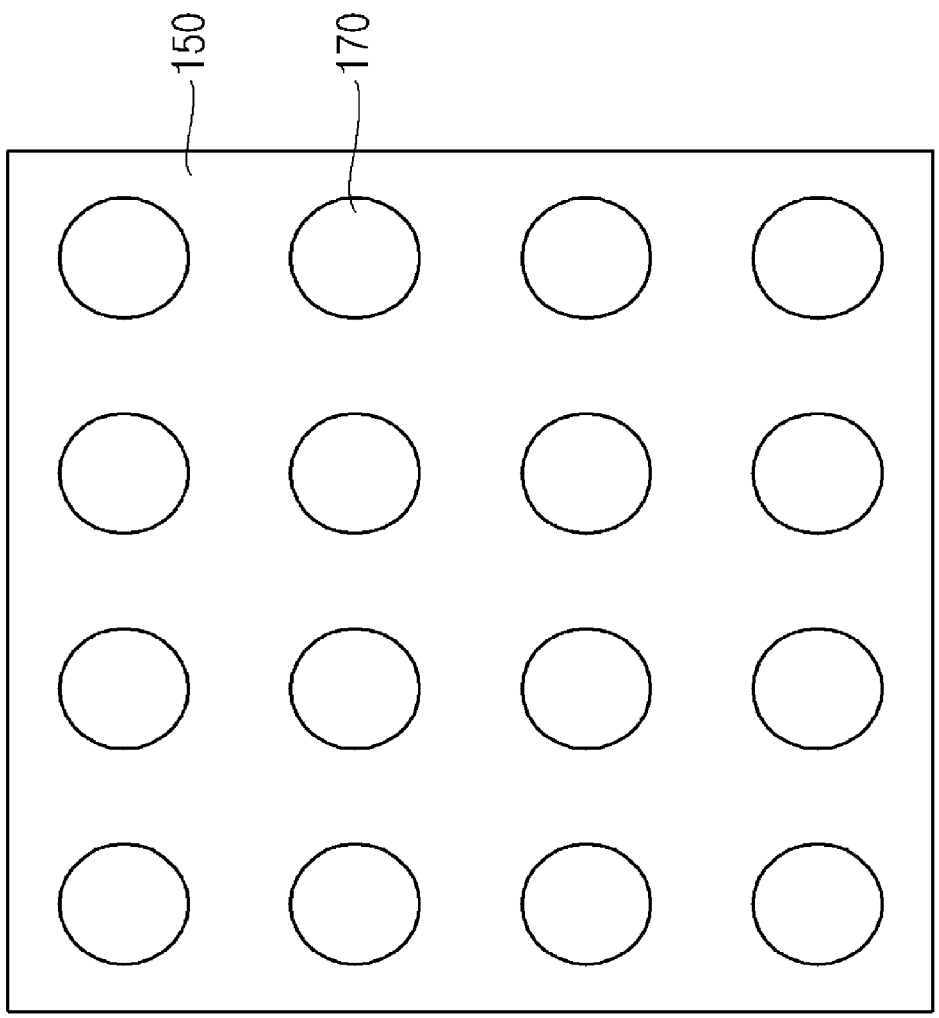
FIG. 5 is a plan view illustrating a state in which an under bump metal (UBM) is formed in the semiconductor package, in accordance with an example embodiment of the invention.

FIG. 1 is a cross-sectional view of a semiconductor package according to an example embodiment of the present invention. FIG. 2 is an enlarged view of an 'A' portion, in accordance with an example embodiment of the present invention. FIG. 3 is a drawing illustrating plating traces coupled to a plating bar, in accordance with an example embodiment of the invention. FIG. 4 is a plan view illustrating a state in which a passivation layer is formed in the semiconductor package, in accordance with an example embodiment of the invention. FIG. 5 is a plan view illustrating a state in which a under bump metal (UBM) is formed in the semiconductor package, in accordance with an example embodiment of the invention.

Referring to FIGS. 1 to 5, the semiconductor package 100 according to an example embodiment of the present invention may include a semiconductor die 110, a first passivation layer 120 formed on the semiconductor die 110, RDLs 140 and 145 formed on the first passivation layer 120, a second passivation layer 150 formed on the RDLs 140 and 145, an under bump metal (UBM) 170 formed on the second passivation layer 150, and a solder bump 180 formed to surround an upper portion of the UBM 170. In addition, RDL seed layers 130 and 135 may be formed under the RDLs 140 and 145, and an UBM seed layer 160 may be formed under the UBM 170.

The semiconductor die 110 is generally made of a silicon material and may include a plurality of semiconductor devices. A bond pad 111 and a semiconductor die passivation layer 112 are formed on the semiconductor die 110. The bond pad 111 is a portion for inputting/outputting an electrical signal to/from the semiconductor die 110 and may include a plurality of bond pads provided on a top surface of the semiconductor die 110. The semiconductor die passivation layer 112 is formed on the top surface of the semiconductor die 110 and is formed on an area excluding a region where the bond pad 111 is formed. The semiconductor die passivation layer 112 protects the semiconductor die 110 from external shocks and insulates areas other than the bond pad 111.

The first passivation layer 120 is formed on the semiconductor die 110. The first passivation layer 120 is formed on an area of the semiconductor die 110, other than a region where the bond pad 111 is formed. Therefore, the first passivation layer 120 allows the semiconductor die 110 to be electrically insulated in the area of the semiconductor die 110, other than the region where the bond pad 111 is formed. The first passivation layer 120 may be made of one or more of polyimide (PI), benzocyclobutene (BCB), polybenzoxazole (PBO), bis-maleimide-triazine (BT), phenolic resin, epoxy, silicone, oxide ($SiO_2$), nitride ($Si_3N_4$) and equivalents thereof, but the present invention does not necessarily limit the material of the first passivation layer 120 to those listed herein.

The RDL seed layers 130 and 135 include a first RDL seed layer 130 and a second RDL seed layer 135. The first RDL seed layer 130 and the second RDL seed layer 135 are formed on the first passivation layer 120. The first RDL seed layer 130 and the second RDL seed layer 135 function as seeds for forming the first RDL 140 and the second RDL 145. That is to say, if the first RDL seed layer 130 and the second RDL seed layer 135 are formed by electroplating, a path for the flow of current is provided, thereby forming the first RDL 140 and the second RDL 145 on the first RDL seed layer 130 and the second RDL seed layer 135. However, if the first RDL 145 and the second RDL 145 are formed by electroless plating, the first RDL seed layer 130 and the second RDL seed layer 135 might not be provided.

The RDLs 140 and 145 include a first RDL 140 and a second RDL 145. The first RDL 140 and the second RDL 145 are formed on the first RDL seed layer 130 and the second RDL seed layer 135. In addition, if the first RDL seed layer 130 and the second RDL seed layer 135 are not provided, the first RDL 140 and the second RDL 145 may be formed on the first passivation layer 120.

The first RDL 140 and the second RDL 145 serve to redistribute an electrical path of the semiconductor die 110. That is to say, the first RDL 140 and the second RDL 145 redistribute the electrical path to be electrically connected to the solder bump 180 to allow the solder bump 180 to match a pattern of an external circuit, irrespective of a position of the bond pad 111. The first RDL 140 and the second RDL 145 may be made of copper or an equivalent thereof, for example.

One end of the first RDL 140 is electrically connected to the bond pad 111 of the semiconductor die 110. In addition, the other end of the first RDL 140 is exposed by the second passivation layer 150 to then be electrically connected to the UBM 170. The first RDL 140 includes a first region 141a and a second region 141b, corresponding to an exposed region 141 exposed by the second passivation layer 150. In addition, the first RDL 140 includes a bond pad connecting region 142 formed on the bond pad 111 of the semiconductor die 110 and electrically connected to the bond pad 111.

The second RDL 145 is formed between the first region 141a and the second region 141b of the first RDL 140 while passing through the other end of the first RDL 140. In addition, the first RDL 140 and the second RDL 145 are formed on the same plane to be spaced apart from each other while intersecting each other. The passivation layer 150 is formed to cover an intersection area of the first RDL 140 and the second RDL 145. Therefore, the first RDL 140 and the second RDL 145 are electrically insulated. In addition, the second RDL 145 and the UBM 170 may also be electrically insulated by the second passivation layer 150. That is to say, the first RDL 140 and the second RDL 145 are allowed to intersect each other, thereby overcoming a spatial limitation of RDL design due to the necessity of RDLs being designed such that one RDL should be distributed to be spaced apart from another RDL when the RDLs are formed on the same plane. Therefore, it is possible to increase the degree of freedom in RDL design while electrically insulating different RDLs.

The second passivation layer 150 is formed on the first RDL 140 and the second RDL 145. The second passivation layer 150 has an opening formed at a region, thereby exposing the first region 141*a* and the second region 141*b*, corresponding to the exposed region 141 of the first RDL 140. The exposed region 141 of the first RDL 140 formed by the second passivation layer 150 becomes a path electrically connecting the first RDL 140 to an external device. In addition, an insulating region 151 of the second passivation layer 150 is formed while covering the intersection area of the first RDL 140 and the second RDL 145. Therefore, the first RDL 140 and the second RDL 145 are insulated from each other and the second RDL 145 and the UBM 170 are insulated from each other by the insulating region 151.

The second passivation layer 150 may be made of one or more of polyimide (PI), benzocyclobutene (BCB), polybenzoxazole (PBO), bismaleimide-triazine (BT), phenolic resin, epoxy, silicone, oxide ($SiO_2$), nitride ($Si_3N_4$) and equivalents thereof, but the present invention does not necessarily limit the material of the second passivation layer 150 to those listed herein.

The UBM seed layer 160 is formed on the exposed region 141 of the first RDL 140 and covers the opening of the second passivation layer 150 and areas around the opening. Therefore, the UBM seed layer 160 is electrically connected to the first RDL 140 through the exposed region 141 of the first RDL 140.

If the UBM 170 is formed by electroplating, a path for the flow of current is provided. The UBM seed layer 160 may be made of copper or an equivalent thereof.

The UBM 170 is formed on the UBM seed layer 160. The UBM 170 is provided to facilitate a connection between the RDL 140 and the solder bump 180. In the illustrated embodiment, the UBM 170 may include a single layer. In practice, the UBM 170 may include a plurality of layers. The UBM 170 may, for example, include chrome/chrome-copper alloy/copper (Cr/Cr—Cu/Cu), titanium-tungsten alloy/copper (Ti—W/Cu), aluminum/nickel/copper (Al/Ni/Cu), or equivalents thereof.

The solder bump 180 is formed to cover a top portion of the UBM 170. The solder bump 180 establishes a path allowing the semiconductor die 110 to match a pattern of an external circuit. The solder bump 180 may, for example, be made of tin (Sn), lead (Pb), silver (Ag), alloys thereof or equivalents thereof.

As described above, in the semiconductor package 100 according to the example embodiment of the present invention, the second RDL 145 may be allowed to pass through the region where the first RDL 140 is located. In addition, the first RDL 140 and the second RDL 145 are formed to be spaced apart from each other, and the insulating region 151 of the second passivation layer 150 is formed while covering the intersection area of the first RDL 140 and the second RDL 145. Therefore, the first RDL 140 and the second RDL 145 are electrically insulated. In an embodiment of the present invention, it is possible to overcome a spatial limitation of RDL design due to the necessity of RDLs being designed such that one RDL should be distributed to be spaced apart from another RDL when the RDLs are formed on the same plane. Therefore, it is possible to increase the degree of freedom in RDL design while electrically insulating different RDLs.

Hereinafter, a configuration of a semiconductor package according to another embodiment of the present invention will be described.

Figure 7A:
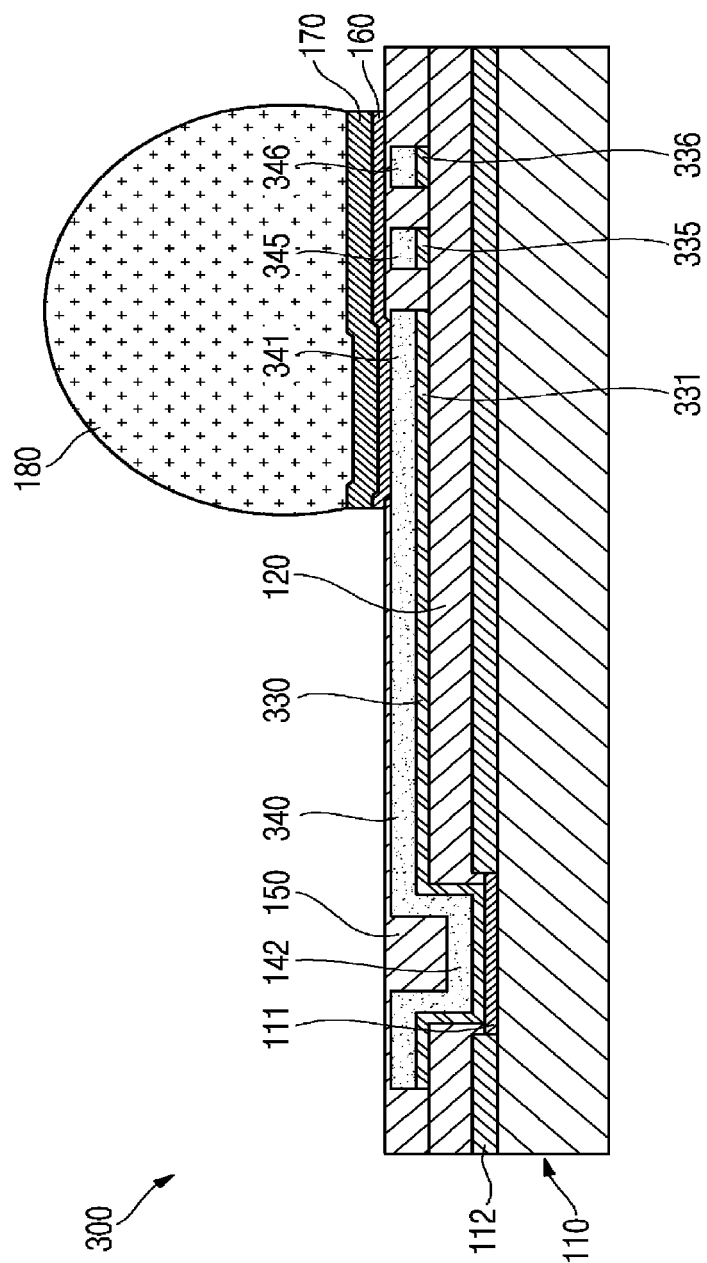
FIG. 7A is a cross-sectional view of a semiconductor package in an example embodiment of the present invention.
Figure 7B:
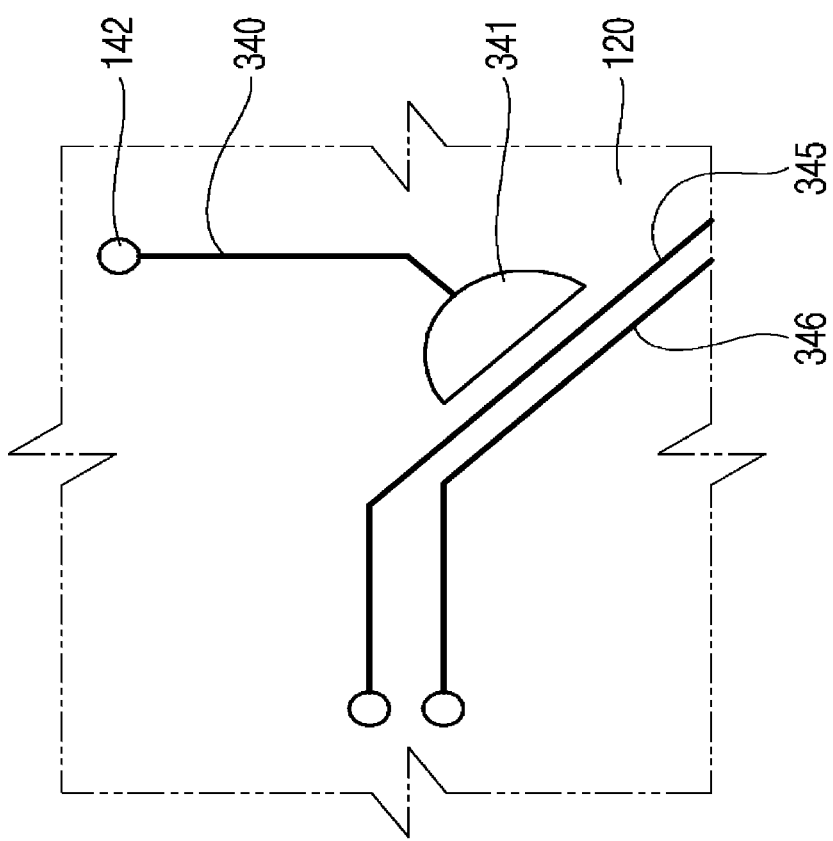
FIG. 7B is a plan view illustrating a state in which a redistribution layer (RDL) is formed in the semiconductor package, in accordance with an example embodiment of the invention.

FIG. 6 is a plan view illustrating a state in which a redistribution layer (RDL) is formed in a semiconductor package, in accordance with an example embodiment of the present invention. FIG. 7A is a cross-sectional view of a semiconductor package in an example embodiment of the present invention. FIG. 7B is a plan view illustrating a state in which a redistribution layer (RDL) is formed in the semiconductor package, in accordance with an example embodiment of the invention.

Referring to FIG. 6, a state in which a first RDL 240 and a second RDL 245 are formed in the semiconductor package 200 according to another example embodiment of the present invention is illustrated.

In the previous embodiment, a first RDL 140 includes only one bond pad connecting region 142 connected to a bond pad 111 at one end of the first RDL 140. In the semiconductor package 200 according to an example embodiment of the present invention, the first RDL 240 may include a plurality of bond pad connecting regions 242*a* and 242*b* connected to the plurality of bond pads (not shown). In addition, the second RDL 245 passing through the first region 241*a* and the second region 241*b* of the first RDL 240 may be electrically connected to another first RDL 246 in the vicinity of the second RDL 245. That is to say, the plurality of bond pads can be electrically connected to one RDL 240. Accordingly, a limitation of redistribution layer (RDL) design can be overcome and the degree of freedom in RDL design can be increased.

Referring to FIG. 7A, the semiconductor package 300 according to still another example embodiment of the present invention may include a semiconductor die 110, a first passivation layer 120 formed on the semiconductor die 110, a plurality of RDLs 340, 345 and 346 formed on the first passivation layer 120, a second passivation layer 150 formed on the RDLs 340, 345 and 346, an UBM 170 formed on the second passivation layer 150 and a solder bump 180 formed to surround a top portion of the UBM 170. In addition, RDL seed layers 330, 335 and 336 may be formed under the RDLs 340, 345 and 346, and an UBM seed layer 160 may be formed under the UBM 170.

Referring to FIGS. 7A and 7B, the semiconductor package 300 may have a plurality of second RDLs 345 and 346 spaced apart from the other end of the first RDL 340.

One end of the first RDL 340 is electrically connected to the bond pad 111 of the semiconductor die 300. In addition, the other end of the first RDL 340 is exposed by the second passivation layer 150 to then be electrically connected to the UBM 170. The first RDL 340 includes an exposed region 341 exposed by the second passivation layer 150, and the exposed region 341 may be connected to one end of the UBM 170.

The plurality of second RDLs 345 and 346 are spaced apart from the other end of the first RDL 340. In addition, the plurality of second RDLs 345 and 346 are spaced apart from each other. Therefore, the first RDL 340 and plurality of second RDLs 345 and 346 are formed on the same plane to be spaced apart from each other. Regions formed between the first RDL 340 and the plurality of second RDLs 345 and 346 are covered by the second passivation layer 150. Therefore, the first RDL 340 is electrically insulated from the plurality of second RDLs 345 and 346, and the plurality of second RDLs 345 and 346 are also electrically insulated from each other. In addition, the plurality of second RDLs 345 and 346 may be electrically insulated from the UBM 170 by the second passivation layer 150.

In the previous example embodiment, the other end of the RDL 140 is entirely connected to the UBM 170. However, in the semiconductor package 300 according to still another embodiment of the present invention, the first RDL 340 is connected to one end of the UBM 170, thereby reducing a contact area between the first RDL 340 and the UBM 170 and forming the plurality of second RDLs 345 and 346 at a lower region of the other end of the UBM 170. The plurality of second RDLs 345 and 346 are spaced apart from the other end of the first RDL 340, and the plurality of second RDLs 345 and 346 are also spaced apart from each other. In addition, the regions formed between the first RDL 340 and the plurality of second RDLs 345 and 346 are covered by the second passivation layer 150. Therefore, the first RDL 340 is electrically insulated from the plurality of second RDLs 345 and 346, and the plurality of second RDLs 345 and 346 are electrically insulated from the UBM 170. That is to say, the plurality of second RDLs 345 and 346 are formed at a potential region where the first RDL 340 is to be formed, thereby overcoming a spatial limitation of RDL design due to the necessity of RDLs being designed such that one RDL should be distributed to be spaced apart from another RDL when the RDLs are formed on the same plane. Therefore, it is possible to increase the degree of freedom in RDL design while electrically insulating different RDLs.

Hereinafter, a fabricating method of a semiconductor package 100 according to an example embodiment of the present invention will be described.

Figure 8:
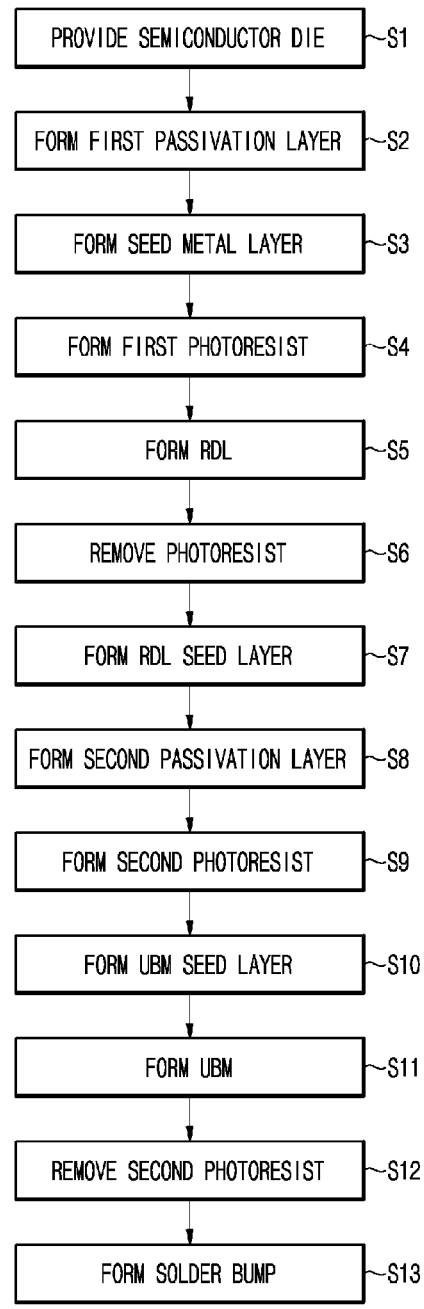
FIG. 8 is a flowchart illustrating a fabricating method of a semiconductor package, in accordance with an example embodiment of the present invention.
Figures 9A, 9B, 9C:
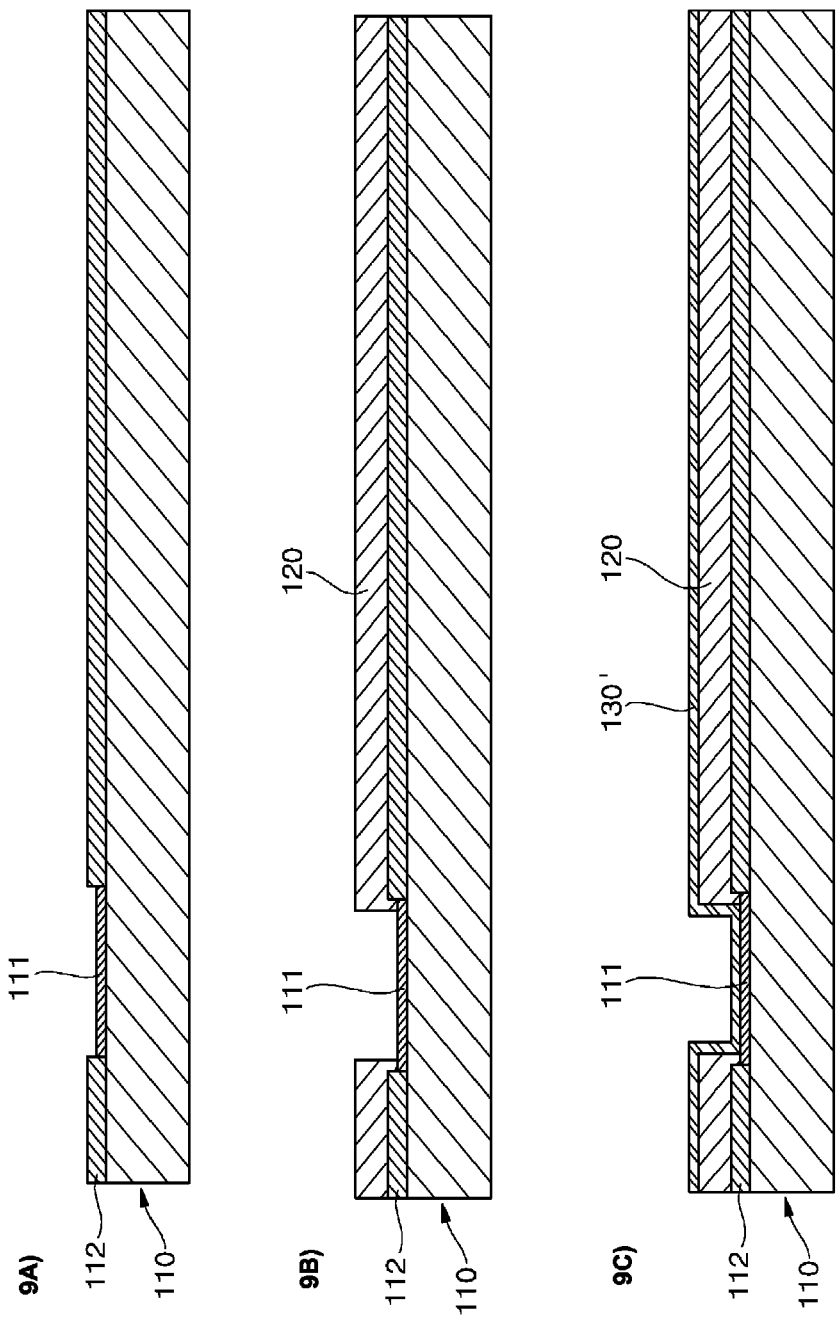
FIGS. 9A to 9P are cross-sectional views illustrating process steps in a fabricating method of a semiconductor package, in accordance with an example embodiment of the present invention.

FIG. 8 is a flowchart illustrating a fabricating method of a semiconductor package, in accordance with an example embodiment of the present invention. FIGS. 9A to 9P are cross-sectional views illustrating process steps in a fabricating method of a semiconductor package, in accordance with an example embodiment of the present invention.

Referring to FIGS. 8 and 9A, in order to fabricate the semiconductor package 100 according to an example embodiment of the present invention, first, a semiconductor die is provided, the semiconductor die having a bond pad 111 and a semiconductor die passivation layer 112 formed thereon (S1).

Referring to FIGS. 8 and 9B, a first passivation layer 120 is formed on the passivation layer 112 of the semiconductor die 110 (S2). The first passivation layer 120 may be made of one or more of polyimide (PI), benzocyclobutene (BCB), polybenzoxazole (PBO), bismaleimidetriazine (BT), phenolic resin, epoxy, silicone, oxide ($SiO_2$), nitride ($Si_3N_4$) and equivalents thereof, but the present invention does not necessarily limit the material of the first passivation layer 120 to those listed herein.

Referring to FIGS. 8 and 9C, a seed metal layer 130' is formed on the entire surface of the semiconductor die 110 and the first passivation layer 120 (S3). The seed metal layer 130' is made of a metal, such as copper and is formed on the bond pad 111 to be electrically connected to the bond pad 111.

Figures 9D, 9E, 9F:
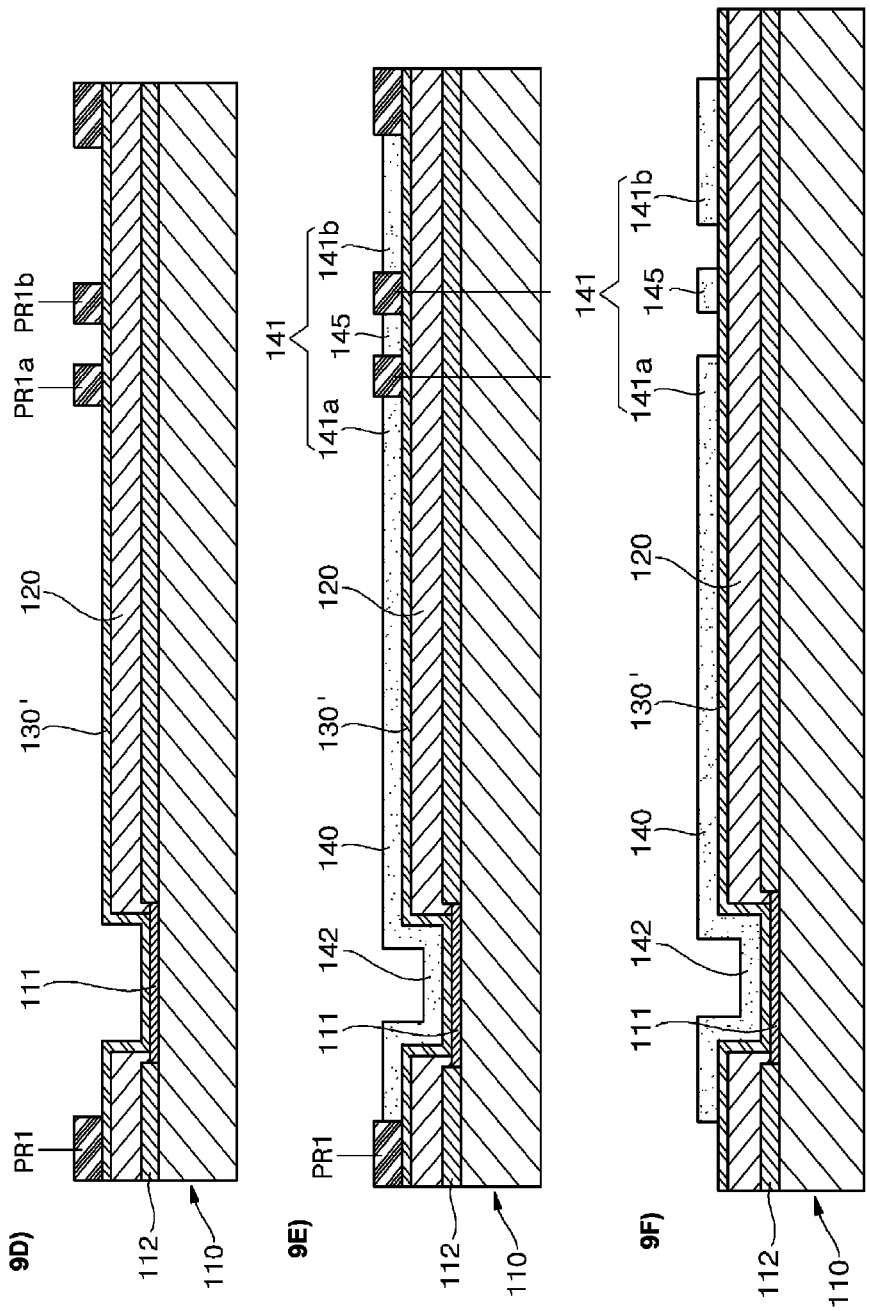

Referring to FIGS. 8 and 9D, a first photoresist is formed, that is, a first photoresist PR1 is coated on the seed metal layer 130' and patterned (S4). The first photoresist PR1 is formed at regions corresponding to potential regions where a first RDL 140 and a second RDL 145 are to be formed. In particular, the first photoresist PR1 may include a first region PR1a and a second region PR1b, and the second RDL 145 is formed between the first region PR1a and the second region PR1b. Therefore, the first RDL 140 and the second RDL 145 may be spaced apart from each other by the first region PR1a and the second region PR1b.

Referring to FIGS. 8 and 9E, the first RDL 140 and the second RDL 145 are formed by filling a region between patterns of the first photoresist PR1 with a metal (S5). The second RDL 145 is formed between the first region PR1a and the second region PR1b to be spaced apart from the first RDL 140. The first RDL 140 and the second RDL 145 may be formed by, for example, electroplating. That is to say, the first RDL 140 and the second RDL 145 may be formed by applying a current to the seed metal layer 130' used as a seed. Here, the first RDL 140 and the second RDL 145 may be made of copper or an equivalent thereof.

Referring to FIGS. 8 and 9F, the first photoresist PR1 is removed (S6). The first photoresist PR1 may be removed by, for example, ashing.

Figure 9G:
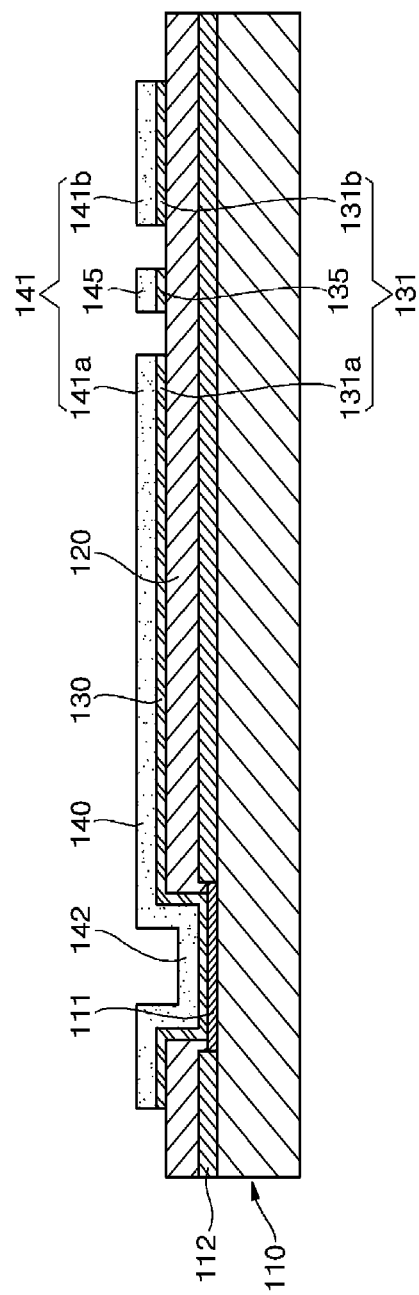
Figure 9H:
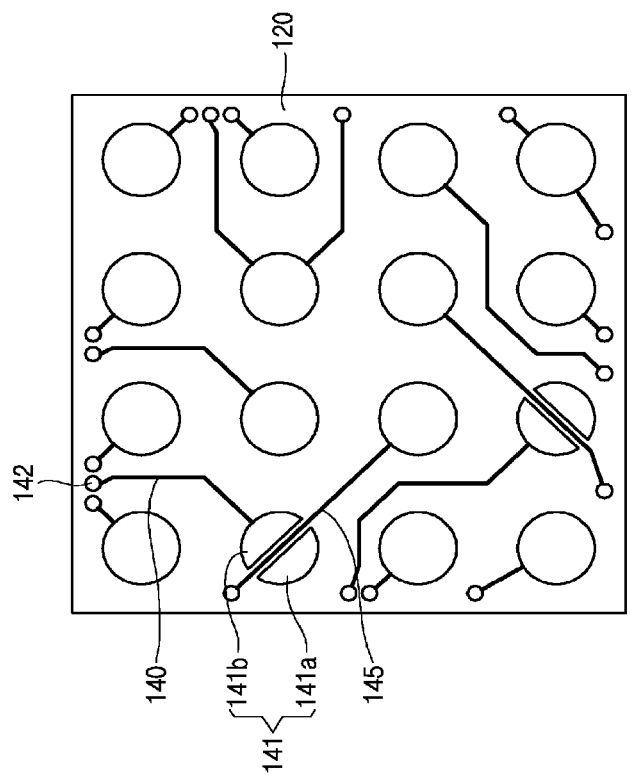

Referring to FIGS. 8, 9G and 9H, an RDL seed layer consisting of a first RDL seed layer 130 and a second RDL seed layer 135 is formed by etching the seed metal layer 130' (S7). A separate mask is not used in etching, but blanket etching may be performed using the first RDL 140 and the second RDL 145 as masks. At this stage, the first RDL 140 and the second RDL 145 are also etched. However, since a thickness of the seed metal layer 130' is smaller than thicknesses of the first RDL 140 and the second RDL 145, only the seed metal layer 130' may be etched and patterned using a difference in the etch rate without affecting the thicknesses of the first RDL 140 and the second RDL 145.

In particular, as shown in FIG. 9H, the first RDL 140 and the second RDL 145 are formed on the first passivation layer 120. In addition, the second RDL 145 may be positioned between the first region 141a and the second region 141b of the first RDL 140.

Figure 9I:
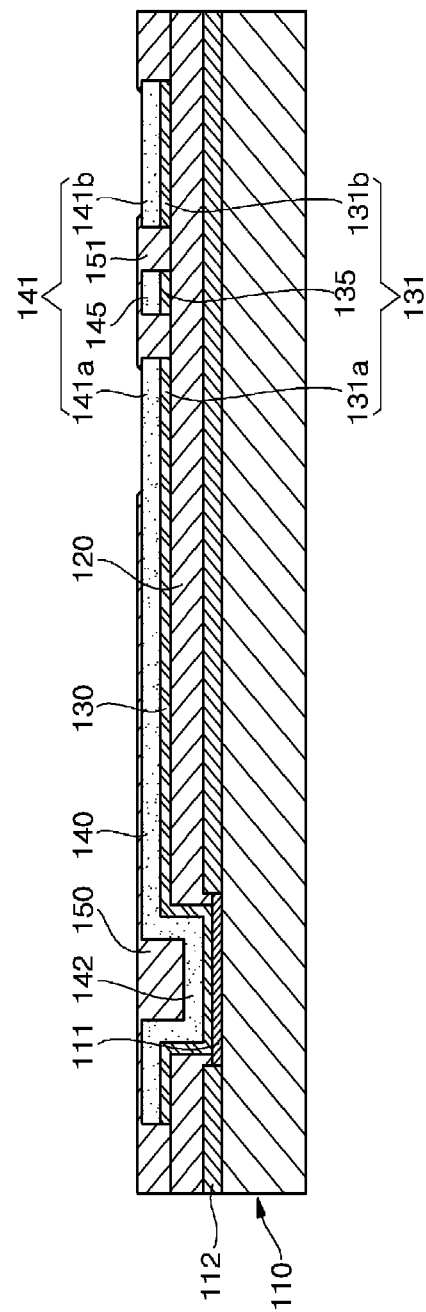

Referring to FIGS. 8, 9I and 9J, a second passivation layer 150 is formed on the first RDL 140 and the second RDL 145 (S8). The second passivation layer 150 is formed to have a uniform height of its top surface. Here, the second passivation layer 150 has an opening formed at a portion, thereby exposing a first region 141a and a second region 141b, corresponding to an exposed region 141. In addition, an insulating region 151 of the second passivation layer 150 is formed while covering the intersection area of the first RDL 140 and the second RDL 145. Therefore, the first RDL 140 and the second RDL 145 are insulated from each other and the second RDL 145 and the UBM 170 are insulated from each other by the insulating region 151. The second passivation layer 150 may be made of one or more of polyimide (PI), benzocyclobutene (BCB), polybenzoxazole (PBO), bismaleimide-triazine (BT), phenolic resin, epoxy, silicone, oxide ($SiO_2$), nitride ($Si_3N_4$) and equivalents thereof, but the present invention does not necessarily limit the material of the second passivation layer 150 to those listed herein.

In particular, as shown in FIG. 9J, the second passivation layer 150 is formed on the first RDL 140 and the second RDL 145 (not shown). The insulating region 151 of the second passivation layer 150 is formed to cover the intersection area of the first RDL 140 and the second RDL 145. In addition, the second passivation layer 150 has an opening formed at a portion, thereby exposing the first region 141a and the second region 141b of the first RDL 140.

Referring to FIGS. 8 and 9K, a second photoresist is formed by coating second photoresist PR2 on the second passivation layer 150 and patterning the same (S9). The second photoresist PR2 is formed only at a region other than a potential region where the UBM is to be formed.

Referring to FIGS. 8 and 9L, an UBM seed layer is formed by filling an UBM seed layer 160 between patterns of the second photoresist PR2 (S10). The UBM seed layer 160 covers the opening of the second passivation layer 150 and areas around the opening while covering the first region 141a and the second region 141b of the first RDL 140. Therefore, the UBM seed layer 160 is electrically connected to the underlying first RDL 140 through the exposed region 141 of the first RDL 140. The UBM seed layer 160 may, for example, be generally made of copper or an equivalent thereof.

Figure 9M:
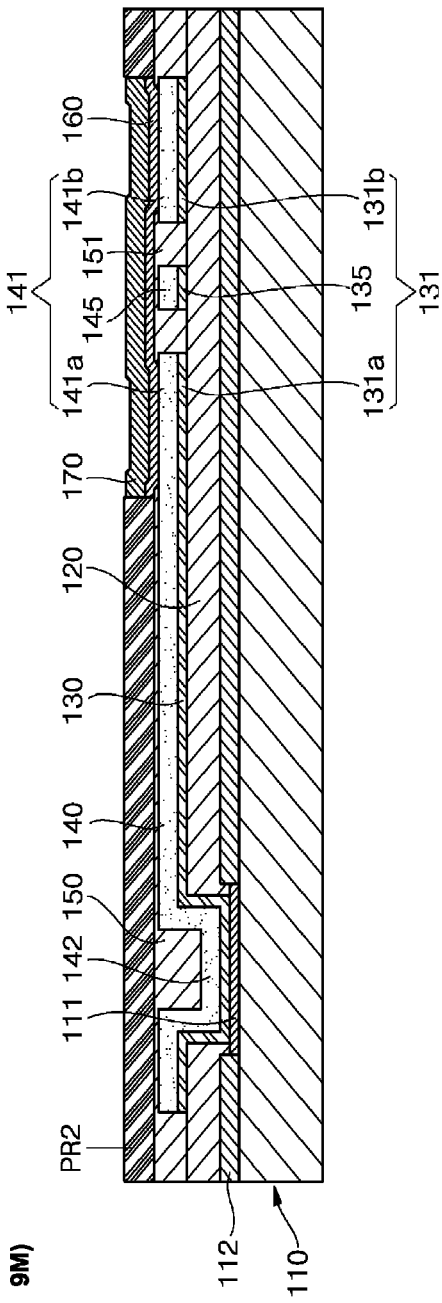

Referring to FIGS. 8 and 9M, an UBM 170 is formed by filling with a region between patterns of the second photoresist PR2 having the UBM seed layer 160 with a metal (S11). The UBM 170 is formed on the UBM seed layer 160 to then be electrically connected to the UBM seed layer 160. The UBM 170 may, for example, include chrome/chrome-copper alloy/copper (Cr/Cr—Cu/Cu), titanium-tungsten alloy/copper (Ti—W/Cu), aluminum/nickel/copper (Al/Ni/Cu), or equivalents thereof.

Figure 9N:
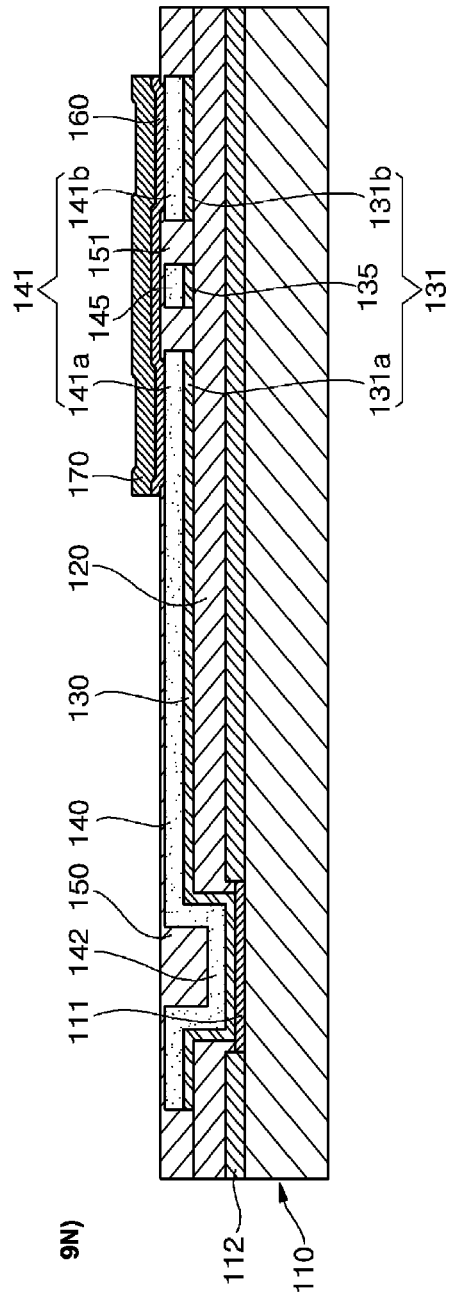
Figure 9P:
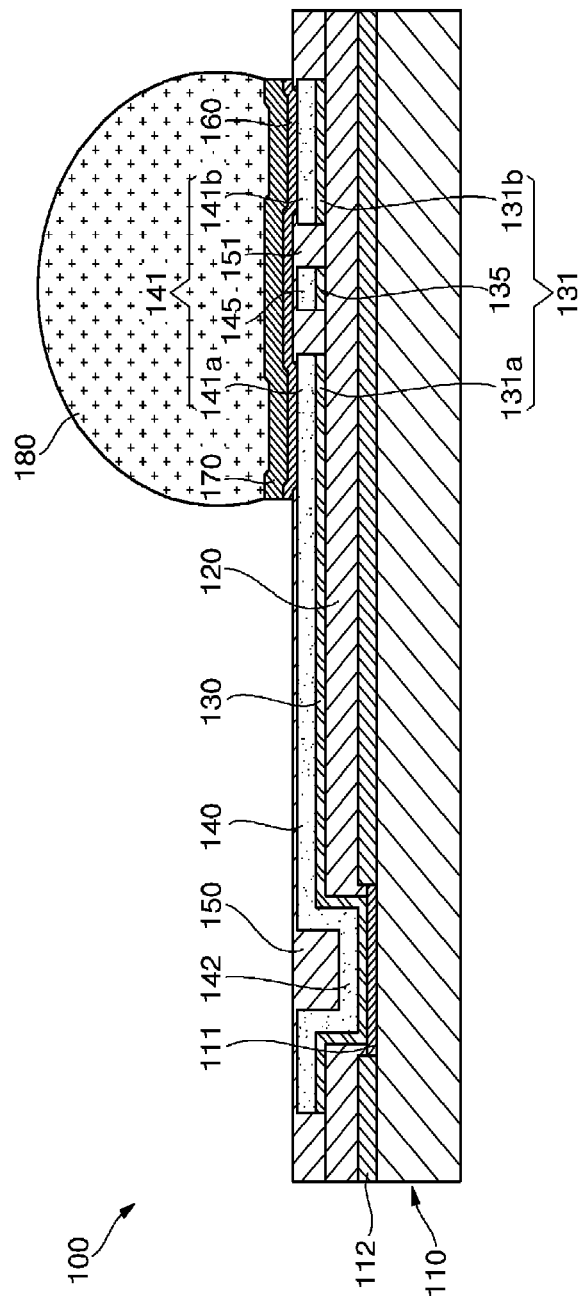

Referring to FIGS. 8, 9N and 9O, the second photoresist PR2 is removed (S12). The second photoresist PR2 may be removed by, for example, ashing.

In particular, as shown in FIG. 9O, the UBM 170 is formed on the second passivation layer 150.

Referring to FIGS. 8 and 9P, a solder bump 180 is formed on the UBM 170 to surround a top portion of the UBM 170 (S13). The solder bump 180 is electrically connected to the bond pad 111 of the semiconductor die 110 through the UBM 170 and the first RDL 140.

This disclosure provides example embodiments of the present invention. The scope of the present invention is not limited by these example embodiments. Numerous variations, whether explicitly provided for by the specification or implied by the specification, such as variations in structure, dimension, type of material and manufacturing process, may be implemented by one skilled in the art in view of this disclosure.

In an embodiment of the invention, a semiconductor package with improved redistribution layer design and fabricating method thereof is disclosed and may comprise a semiconductor die comprising a plurality of bond pads, a first redistribution layer (RDL) formed on the semiconductor die with a first end coupled to a bond pad and a second end coupled to a solder bump via one or more under bump metal layers, and a second RDL formed in a same plane of the semiconductor die as at least a portion of the first RDL and electrically isolated from the first RDL. A first end of the second RDL may be coupled to at least one of the plurality of bond pads and the second RDL may passes underneath, but electrically isolated from, the solder bump coupled to the second end of the first RDL. A passivation layer may be formed on the first RDL and the second RDL exposing the second end of the first RDL. The one or more under bump metal layers may be formed on the second end of the first RDL exposed by the passivation layer. The passivation layer may electrically isolate the first RDL and the solder bump from the at least one second RDL. The passivation layer may be formed between the under bump metal and the second RDL. The passivation layer may be formed between the first RDL and the second RDL. The passivation layer may comprise one or more of: polyimide (PI), benzocyclobutene (BCB), polybenzoxazole (PBO), bis-maleimide-triazine (BT), phenolic resin, epoxy, silicone, oxide ($SiO_2$), and nitride ($Si_3N_4$), for example. A second end of the second RDL may be coupled to a second solder bump via one or more under bump metal layers. A third RDL may pass underneath, but electrically isolated from, the solder bump coupled to the second end of the first RDL. The first RDL and the second RDL may be formed on one or more seed layers.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor package comprising:
   a semiconductor die comprising a plurality of bond pads;
   a first redistribution layer (RDL) on the semiconductor die;
   a second RDL in a same plane of the semiconductor package as at least a portion of the first RDL, the second RDL being electrically isolated from the first RDL; and
   an interconnection structure over at least the portion of the first RDL and a portion of the second RDL;
   wherein:
   the second RDL passes underneath a center of, but is electrically isolated from, the interconnection structure; and
   the portion of the first RDL comprises a majority of an area under the interconnection structure.

2. The package according to claim 1, wherein a passivation layer is formed on the first RDL and the second RDL exposing a second end of the first RDL.

3. The package according to claim 2, wherein one or more under bump metal layers is on the second end of the first RDL exposed by the passivation layer.

4. The package according to claim 2, wherein the passivation layer electrically isolates the first RDL and the solder bump from the second RDL.

5. The package according to claim 3, wherein the passivation layer is between the one or more under bump metal layers and the second RDL.

6. The package according to claim 2, wherein the passivation layer is formed between the first RDL and the second RDL.

7. The package according to claim 2, wherein the passivation layer comprises one or more of: polyimide (PI), benzocyclobutene (BCB), polybenzoxazole (PBO), bismaleimide-triazine (BT), phenolic resin, epoxy, silicone, oxide ($SiO_2$), and nitride ($Si_3N_4$).

8. The package according to claim 1, wherein a second end of the second RDL is coupled to a second interconnection structure via one or more under bump metal layers.

9. The package according to claim 1, wherein a third RDL passes underneath, but is electrically isolated from, the interconnection structure.

10. The package according to claim 1, wherein the first RDL and the second RDL are formed on one or more seed layers.

11. The package according to claim 1, wherein:
    a first end of the first RDL is coupled to at least one of said plurality of bond pads and a second end of the first RDL is coupled to the interconnection structure via one or more under bump metal layers;

a first end of the second RDL is coupled to at least one of said plurality of bond pads; and the interconnection structure comprises a solder bump.

12. A method for forming a semiconductor package, the method comprising:
   providing a semiconductor die comprising a plurality of bond pads;
   forming a first redistribution layer (RDL) on the semiconductor die, the first RDL having a first end coupled to a bond pad and a second end coupled to a solder bump via one or more under bump metal layers;
   forming a second RDL in a same plane of the semiconductor package as at least a portion of the first RDL, the second RDL being electrically isolated from the first RDL; and
   coupling a first end of the second RDL to at least one of said plurality of bond pads;
   wherein:
      the second RDL passes underneath a center of, but is electrically isolated from, the solder bump coupled to the second end of the first RDL; and
      the portion of the first RDL comprises a majority of an area under the solder bump.

13. The method according to claim 12, comprising forming a passivation layer on the first RDL and the second RDL exposing the second end of the first RDL.

14. The method according to claim 13, comprising forming the one or more under bump metal layers on the second end of the first RDL exposed by the passivation layer.

15. The method according to claim 13, wherein the passivation layer electrically isolates the first RDL and the solder bump from the second RDL.

16. The method according to claim 13, comprising forming the passivation layer between the under bump metal and the second RDL.

17. The method according to claim 13, comprising forming the passivation layer between the first RDL and the second RDL.

18. The method according to claim 13, wherein the passivation layer comprises one or more of: polyimide (PI), benzocyclobutene (BCB), polybenzoxazole (PBO), bismaleimide-triazine (BT), phenolic resin, epoxy, silicone, oxide ($SiO_2$), and nitride ($Si_3N_4$).

19. The method according to claim 12, comprising coupling a second end of the second RDL to a second solder bump via one or more under bump metal layers.

20. The method according to claim 12, wherein a third RDL passes underneath, but is electrically isolated from, the solder bump coupled to the second end of the first RDL.

21. A semiconductor package comprising:
   a semiconductor die comprising a plurality of bond pads;
   a first redistribution layer (RDL) over the semiconductor die;
   a second RDL in a same plane of the semiconductor package as at least a portion of the first RDL and electrically isolated from the first RDL; and
   an interconnection structure over at least the portion of the first RDL and a portion of the second RDL;
   wherein:
      the portion of the second RDL passes underneath, but is electrically isolated from, the interconnection structure; and
      the portion of the first RDL comprises a majority of an area under the interconnection structure.

22. The package according to claim 21, wherein:
   a first end of the first RDL is coupled to at least one of said plurality of bond pads and a second end of the first RDL is coupled to the interconnection structure via one or more under bump metal layers;
   a first end of the second RDL is coupled to at least one of said plurality of bond pads; and
   the interconnection structure comprises a solder bump.

* * * * *